United States Patent
Shishido et al.

(10) Patent No.: US 10,365,555 B2
(45) Date of Patent: Jul. 30, 2019

(54) MASK BLANK, TRANSFER MASK AND METHODS OF MANUFACTURING THE SAME

(71) Applicant: HOYA CORPORATION, Tokyo (JP)

(72) Inventors: Hiroaki Shishido, Tokyo (JP); Osamu Nozawa, Tokyo (JP); Ryo Ohkubo, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 199 days.

(21) Appl. No.: 14/892,260

(22) PCT Filed: May 19, 2014

(86) PCT No.: PCT/JP2014/063222
§ 371 (c)(1),
(2) Date: Nov. 19, 2015

(87) PCT Pub. No.: WO2014/189004
PCT Pub. Date: Nov. 27, 2014

(65) Prior Publication Data
US 2016/0202602 A1    Jul. 14, 2016

(30) Foreign Application Priority Data

May 23, 2013 (JP) ................. 2013-109386

(51) Int. Cl.
| G03F 1/30 | (2012.01) |
| G03F 1/32 | (2012.01) |
| C23G 5/00 | (2006.01) |
| G03F 1/80 | (2012.01) |

(52) U.S. Cl.
CPC ................ *G03F 1/32* (2013.01); *C23G 5/00* (2013.01); *G03F 1/80* (2013.01)

(58) Field of Classification Search
CPC . G03F 1/32; G03F 1/30; G03F 1/0076; G03F 1/0084
USPC ........................................... 430/5
See application file for complete search history.

(56) References Cited

U.S. PATENT DOCUMENTS

| 5,380,608 | A | 1/1995 | Miyashita et al. |
| 6,764,792 | B1 | 7/2004 | Fujikawa et al. |
| 2006/0177746 | A1 | 8/2006 | Yoshikawa et al. |
| 2006/0257755 | A1 | 11/2006 | Inazuki et al. |
| 2006/0292454 | A1* | 12/2006 | Suda .......... G03F 1/29 430/5 |
| 2007/0212618 | A1 | 9/2007 | Yoshikawa et al. |
| 2007/0248897 | A1 | 10/2007 | Yoshikawa et al. |
| 2007/0259276 | A1 | 11/2007 | Yoshikawa et al. |
| 2008/0206655 | A1 | 8/2008 | Nozawa et al. |
| 2009/0246645 | A1 | 10/2009 | Nozawa |
| 2010/0261101 | A1* | 10/2010 | Yoshikawa ...... G03F 1/32 430/5 |
| 2012/0115075 | A1* | 5/2012 | Kominato ....... G03F 1/58 430/319 |

FOREIGN PATENT DOCUMENTS

| JP | 05-289305 A | 11/1993 |
| JP | 06-289589 A | 10/1994 |
| JP | 07-098493 A | 4/1995 |
| JP | 2001-083687 A | 3/2001 |
| JP | 2006-78825 A | 3/2006 |
| JP | 2006-215297 A | 8/2006 |
| JP | 2006-317665 A | 11/2006 |
| JP | 2007-033469 A | 2/2007 |
| JP | 2007-241065 A | 9/2007 |
| JP | 2007-292824 A | 11/2007 |
| JP | 2008-209873 A | 9/2008 |
| JP | 2009-244793 A | 10/2009 |
| JP | 2010-117627 A | 5/2010 |
| KR | 1020070064612 A | 6/2007 |
| KR | 10-2009-0016113 A | 2/2009 |
| KR | 1020110093551 A | 8/2011 |

OTHER PUBLICATIONS

International Search Report of PCT/JP2014/063222 dated Jul. 22, 2014 [PCT/ISA/210].
Communication dated Aug. 10, 2017, issued by the Korean Intellectual Property Office in corresponding Korean Application No. 10-2017-7019202.
Communication dated Aug. 19, 2016 from the Korean Intellectual Property Office in counterpart Application No. 10-2015-7034087.
Communication dated Dec. 12, 2017, issued by the Japanese Patent Office in corresponding Application No. 2014-101446.

* cited by examiner

*Primary Examiner* — Daborah Chacko-Davis
(74) *Attorney, Agent, or Firm* — Sughrue Mion, PLLC (57) ABSTRACT

In a mask blank having a structure in which a light-semitransmissive film and a light-shielding film are laminated on a main surface of a transparent substrate, the light-semitransmissive film is made of a material that can be dry-etched with an etching gas containing a fluorine-based gas, the light-shielding film is made of a material that contains tantalum and one or more elements selected from hafnium and zirconium and contains no oxygen except in a surface layer thereof, an etching stopper film is provided between the light-semitransmissive film and the light-shielding film, and the etching stopper film is made of a material that contains chromium with an oxygen content of 20 at % or less.

9 Claims, 3 Drawing Sheets

MASK BLANK, TRANSFER MASK AND METHODS OF MANUFACTURING THE SAME

CROSS REFERENCE TO RELATED APPLICATIONS

This application is a National Stage of International Application No. PCT/JP2014/063222, filed May 19, 2014, claiming priority based on Japanese Patent Application No. 2013-109386, filed May 23, 2013, the contents of all of which are incorporated herein by reference in their entirety.

TECHNICAL FIELD

This invention relates to a mask blank, a transfer mask, a method of manufacturing the transfer mask, and a method of manufacturing a semiconductor device.

BACKGROUND ART

Generally, fine pattern formation is carried out by the photolithography in manufacturing processes of a semiconductor device. A number of substrates called transfer masks are usually used for this fine pattern formation. The transfer mask is generally such that a fine pattern made of a metal thin film or the like is provided on a transparent glass substrate. The photolithography is used also in the manufacture of the transfer mask.

For miniaturization of a pattern of a semiconductor device, it is necessary to shorten the wavelength of an exposure light source for use in the photolithography in addition to the miniaturization of a mask pattern formed in a transfer mask. In recent years, the wavelength of an exposure light source for use in the manufacture of a semiconductor device has been shortened from KrF excimer laser (wavelength 248 nm) to ArF excimer laser (wavelength 193 nm).

As a type of transfer mask, a halftone phase shift mask is known apart from a conventional binary mask having a light-shielding film pattern made of a chromium-based material on a transparent substrate. This halftone phase shift mask is configured to have a light-semitransmissive film pattern on a transparent substrate. This light-semitransmissive film (halftone phase shift film) has a function of transmitting light therethrough with an intensity that does not substantially contribute to exposure, and further has a function of providing the light transmitted therethrough with a predetermined phase difference relative to light transmitted in air for the same distance, thereby producing a so-called phase shift effect.

Generally, in a transfer mask, an outer peripheral area of an area where a transfer pattern is formed is required to have an optical density (OD) of a predetermined value or more so that when exposure and transfer are carried out on a resist film on a semiconductor wafer using an exposure apparatus, the resist film is prevented from being affected by exposure light transmitted through the outer peripheral area. Normally, it is said that the OD is desirably 3 or more and should be at least about 2.8 at the outer peripheral area of the transfer mask. However, a light-semitransmissive film of a halftone phase shift mask has a function of transmitting exposure light therethrough at a predetermined transmittance and therefore the optical density required for the outer peripheral area of the transfer mask is difficult to achieve only with this light-semitransmissive film. In view of this, like a phase shift mask blank disclosed in JP-A-2007-033469 (Patent Document 1), a light-shielding film (light-shieldable film) is laminated on a semitransparent film with a predetermined phase shift amount and transmittance for exposure light, thereby achieving a predetermined optical density with the laminated structure of the semitransparent film and the light-shielding film.

On the other hand, there is also present a photomask blank as disclosed in JP-A-2006-215297 (Patent Document 2). A semitransparent laminated film of this photomask blank is configured in such a way that a phase advancing film having a property that the phase of exposure light transmitted through this film is advanced relative to that of exposure light transmitted in air for the same distance and a phase delaying film having a property that the phase of exposure light transmitted through this film is delayed, vice versa, are laminated together. With this structure, it is possible to prevent the occurrence of a phase difference between exposure light transmitted through the semitransparent laminated film and exposure light transmitted in air for the same distance. Even with the semitransparent laminated film having such a property, the optical density required for the outer peripheral area of the transfer mask is difficult to achieve alone. Therefore, also in the photomask blank disclosed in Patent Document 2, a light-shielding film is laminated on the semitransparent laminated film, thereby achieving a predetermined optical density with the laminated structure of the semitransparent laminated film and the light-shielding film.

PRIOR ART DOCUMENT

Patent Document

Patent Document 1: JP-A-2007-033469
Patent Document 2: JP-A-2006-215297

SUMMARY OF THE INVENTION

Problem to be Solved by the Invention

A transfer mask of the type in which a transfer pattern is formed using a thin film (light-semitransmissive film) that transmits exposure light at a predetermined transmittance, as disclosed in Patent Document 1 or Patent Document 2, is manufactured using a mask blank in which a light-shielding film is laminated on a light-semitransmissive film. In the transfer mask manufactured from this mask blank, only a pattern of the light-semitransmissive film is present in an area, where a transfer pattern is formed, on a substrate except a specific area where a light-shielding patch or the like should be formed. On the other hand, in an outer peripheral area (blind area) where a predetermined optical density is required, there is present a layer (light-shielding band) in which the light-semitransmissive film and the light-shielding film are laminated together. Since it is necessary to manufacture the transfer mask thus configured, if the light-semitransmissive film and the light-shielding film are laminated together with no other film interposed therebetween, the light-semitransmissive film and the light-shielding film should be made of materials having mutually different etching characteristics.

The sequence of manufacturing the transfer mask from the mask blank described above is as follows. First, a first resist pattern having a pattern to be formed in the light-semitransmissive film is provided on the light-shielding film. Then, using the first resist pattern as a mask, the light-shielding film is etched to form a pattern. Then, the first resist pattern is removed. Then, using the pattern of the light-shielding film as a mask, the light-semitransmissive film is etched to form a light-semitransmissive film pattern. Then, a second resist pattern having a pattern to be formed in the light-shielding film is provided on the light-shielding film. Then, using the second resist pattern as a mask, the light-shielding film is etched to form a light-shielding film pattern (light-shielding band). Finally, the second resist pattern is removed and, through a predetermined cleaning process, the transfer mask is completed.

The pattern to be formed in the light-semitransmissive film is a very fine pattern because it is to be exposed and transferred to a resist film on a semiconductor wafer. However, since the light-shielding film is laminated on the light-semitransmissive film in the mask blank, the pattern to be formed in the light-semitransmissive film should be once formed in the light-shielding film. As described above, in many cases, the light-semitransmissive film is provided with the function in addition to the function of transmitting exposure light therethrough at a predetermined transmittance. In order to provide the light-semitransmissive film with such properties, use is often made of a material containing silicon or a material containing silicon and a transition metal. When forming a fine pattern in the light-semitransmissive film made of such a material, the light-semitransmissive film is desirably patterned by dry etching with an etching gas containing a fluorine-based gas.

In order to achieve the above-described transfer mask manufacturing processes on the assumption that the light-semitransmissive film is patterned by the dry etching with the etching gas containing the fluorine-based gas, the light-shielding film should be made of a material having resistance to the dry etching with the etching gas containing the fluorine-based gas. In addition, it is also necessary that the pattern to be formed in the light-semitransmissive film can be formed in the light-shielding film with an etching gas other than the fluorine-based gas. Further, as described above, in the area, where the light-semitransmissive film pattern is formed, except the specific area where the light-shielding patch or the like should be formed, the light-shielding film right above it is entirely removed. Therefore, it is desired that the light-semitransmissive film have sufficient etching selectivity against an etching gas for use in dry etching when removing the light-shielding film. As a material of the light-shielding film that simultaneously satisfies these conditions, a material containing chromium can be cited and has conventionally been used. An etching gas for use in forming a fine pattern in the light-shielding film made of the material containing chromium is a mixed gas of chlorine-based gas and oxygen gas.

However, a resist film made of a generally used organic material has a very low resistance to plasma of an oxygen gas compared to a resistance to plasma of another gas. Therefore, when the light-shielding film of the chromium-based material is dry-etched with the mixed gas of chlorine-based gas and oxygen gas, the consumption of the resist film (the amount of film loss of the resist film that occurs during the etching) becomes large. In order to form a fine pattern in the light-shielding film with high accuracy by dry etching, the resist film should remain with a predetermined thickness or more upon completion of patterning of the light-shielding film. However, if the thickness of the resist film to be formed with a pattern is set large at the beginning, the cross-sectional aspect ratio (ratio of film thickness to pattern line width) of a resist pattern becomes too large, so that the phenomenon of collapse of the resist pattern tends to occur.

Besides the chromium-based material, there is also present a material having resistance to the etching gas containing the fluorine-based gas. For example, a thin film made of a material such as a tantalum-hafnium alloy, a tantalum-zirconium alloy, or a tantalum-hafnium-zirconium alloy (hereinafter referred to as the tantalum-hafnium alloy or the like) has resistance to dry etching with the etching gas containing the fluorine-based gas, while it can be patterned by dry etching with an oxygen-free chlorine-based gas. The material containing silicon or the material containing silicon and the transition metal, which forms the light-semitransmissive film, has a relatively high resistance to the dry etching with the oxygen-free chlorine-based gas. However, there is a problem that the material such as the tantalum-hafnium alloy or the tantalum-zirconium alloy is easily oxidized and that if the oxidation proceeds, the etching rate of the dry etching with the oxygen-free chlorine-based gas is significantly reduced.

In the case of a mask blank in which a light-shielding film made of the material such as the tantalum-hafnium alloy or the like is laminated on a light-semitransmissive film with no other film interposed therebetween, since the oxidation of the light-shielding film does not proceed so much at a stage of forming a pattern, to be formed in the light-semitransmissive film, in the light-shielding film, the light-shielding film can be fully patterned by dry etching with the oxygen-free chlorine-based gas. However, at a stage of removing the light-shielding film on a light-semitransmissive film pattern, the oxidation of the light-shielding film has proceeded so that the etching rate of dry etching with the oxygen-free chlorine-based gas is significantly reduced. In order to remove the light-shielding film of the material such as the tantalum-hafnium alloy or the like whose oxidation has proceeded as described above, it is effective to carry out dry etching with a chlorine-based gas biased higher than normal. However, since this is the dry etching with a large physical action, a problem arises that there is a possibility of damaging a surface layer of the light-semitransmissive film pattern that is exposed when the light-shielding film is removed. When the light-semitransmissive film is a phase shift film having not only a function of transmitting exposure light therethrough at a predetermined transmittance, but also a function of providing the exposure light transmitted therethrough with a predetermined phase difference relative to exposure light transmitted in air for a distance equal to the thickness of the light-semitransmissive film, the influence due to the damage to the surface layer is particularly large.

As a means to solve such a problem, it is considered to provide an etching stopper film made of a material containing chromium between the light-semitransmissive film and the light-shielding film. However, the etching stopper film made of the material containing chromium does not always have a high resistance to the oxygen-free chlorine-based gas. Particularly, since the dry etching at the stage of removing the light-shielding film is carried out under the high bias condition, the etching stopper film is required to have a higher resistance to the oxygen-free chlorine-based gas.

Therefore, this invention has been made in order to solve the conventional problems and has an object to provide a mask blank, in which a light-shielding film is laminated on a light-semitransmissive film, that can form a fine pattern in the light-semitransmissive film with high accuracy and further that can suppress damage to the light-semitransmissive film caused by dry etching for removing the light-shielding film on a pattern of the light-semitransmissive film. Further, this invention has an object to provide a transfer mask manufactured using this mask blank and a manufacturing method thereof.

Means for Solving the Problem

As a result of intensive studies in order to solve the above-described problems, the present inventors have completed this invention. Specifically, in order to solve the above-described problems, this invention has the following structures.

(Structure 1)

A mask blank comprising a light-semitransmissive film and a light-shielding film on a main surface of a transparent substrate, wherein the light-semitransmissive film is made of a material that is capable of being dry-etched with an etching gas containing a fluorine-based gas, the light-shielding film is made of a material that contains tantalum and one or more elements selected from hafnium and zirconium and contains no oxygen except for a surface layer thereof, an etching stopper film is provided between the light-semitransmissive film and the light-shielding film, and the etching stopper film is made of a material that contains chromium and has an oxygen content of 20 at % or less.

(Structure 2]

The mask blank according to structure 1, wherein the light-shielding film is made of a material that is capable of being dry-etched with an etching gas containing a chlorine-based gas but no oxygen gas and that has etching selectivity relative to the light-semitransmissive film for dry etching with the etching gas containing the fluorine-based gas.

(Structure 3]

The mask blank according to structure 1 or 2, wherein the light-shielding film is made of a material that does not contain a non-metallic element.

(Structure 4)

The mask blank according to any one of structures 1 to 3, wherein a thin film made of an organic material is provided in contact with the light-shielding film.

(Structure 5)

The mask blank according to any one of structures 1 to 4, wherein the etching stopper film is made of a material that has a chromium content of 55 at % or more.

(Structure 6)

The mask blank according to any one of structures 1 to 5, wherein a laminated structure of the light-semitransmissive film, the etching stopper film, and the light-shielding film has an optical density of 2.8 or more for exposure light.

(Structure 7)

The mask blank according to any one of structures 1 to 6, wherein the etching stopper film has a thickness of 8 nm or less.

(Structure 8)

The mask blank according to any one of structures 1 to 7, wherein the light-semitransmissive film is made of a material containing silicon and nitrogen.

(Structure 9)

The mask blank according to any one of structures 1 to 8, wherein the light-semitransmissive film comprises an uppermost layer formed of a material containing silicon and oxygen at a position farthest from the transparent substrate.

(Structure 10)

A transfer mask, wherein:
a light-semitransmissive pattern is formed in the light-semitransmissive film and a light-shielding band pattern is formed in the etching stopper film and the light-shielding film in the mask blank according to any one of structures 1 to 9.

(Structure 11)

A method of manufacturing a transfer mask using the mask blank according to any one of structures 1 to 9, comprising the steps of: forming a light-semitransmissive pattern in the light-shielding film by dry etching with an etching gas containing a chlorine-based gas but no oxygen gas, by using as a mask a first resist film comprising a transfer pattern and formed on the light-shielding film; after removing the first resist film, forming the light-semitransmissive pattern in the etching stopper film by dry etching with an etching gas containing a chlorine-based gas and an oxygen gas, by using as a mask the light-shielding film comprising the light-semitransmissive pattern; forming the light-semitransmissive pattern in the light-semitransmissive film by dry etching with an etching gas containing a fluorine-based gas, by using as a mask the etching stopper film comprising the light-semitransmissive pattern; forming a light-shielding band pattern in the light-shielding film by dry etching with an etching gas containing a chlorine-based gas but no oxygen gas, by using as a mask a second resist film comprising the light-shielding band pattern and formed on the light-shielding film; and forming the light-shielding band pattern in the etching stopper film by dry etching with an etching gas containing a chlorine-based gas and an oxygen gas, by using as a mask the light-shielding film comprising the light-shielding band pattern.

(Structure 12)

The method of manufacturing a transfer mask according to structure 11, wherein the dry etching carried out upon forming the light-shielding band pattern in the light-shielding film is carried out in a higher bias state than the dry etching carried out upon forming the light-semitransmissive pattern in the light-shielding film.

Effect of the Invention

According to this invention, even when manufacturing a transfer mask using a mask blank having a structure in which a light-semitransmissive film made of a material that can be dry-etched with an etching gas containing a fluorine-based gas, an etching stopper film made of a material containing chromium, and a light-shielding film made of a material containing tantalum and at least one element of hafnium and zirconium are laminated in this order, there is no possibility of losing the etching stopper film and thus it is possible to suppress damage to a surface layer of the light-semitransmissive film when the light-shielding film is removed by dry etching with an etching gas containing a chlorine-based gas but no oxygen gas after a transfer pattern is formed in the light-semitransmissive film.

MODE FOR CARRYING OUT THE INVENTION

Hereinbelow, a first embodiment of this invention will be described in detail.

This invention is a mask blank having a structure in which a light-semitransmissive film and a light-shielding film are laminated on a main surface of a transparent substrate. Specifically, as recited in the Structure 1, the light-semitransmissive film is made of a material that can be dry-etched with an etching gas containing a fluorine-based gas, the light-shielding film is made of a material that contains tantalum and at least one element of hafnium and zirconium and contains no oxygen except in a surface layer thereof, an etching stopper film is provided between the light-semitransmissive film and the light-shielding film, and the etching stopper film is made of a material that contains chromium with an oxygen content of 20 at % or less.

Figure 1:
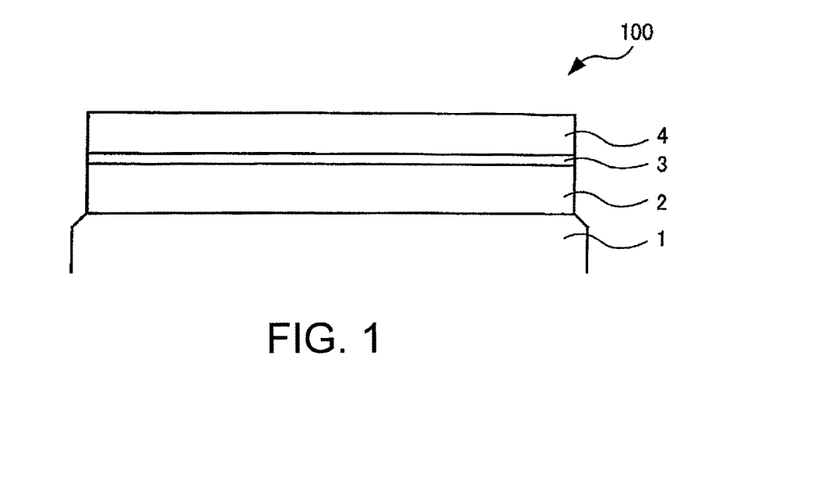
FIG. 1 is a cross-sectional view showing a layer structure of a mask blank according to a first embodiment of this invention.

FIG. 1 is a cross-sectional view showing a layer structure of a mask blank according to this invention. A mask blank 100 of this invention shown in FIG. 1 has a structure in which a light-semitransmissive film 2, an etching stopper film 3, and a light-shielding film 4 are laminated in this order on a transparent substrate 1.

The transparent substrate 1 is not particularly limited as long as it has transparency at an exposure wavelength to be used. In this invention, it is possible to use a synthetic quartz glass substrate or any of various other glass substrates (e.g. soda-lime glass, aluminosilicate glass, etc.). For miniaturization of a pattern of a semiconductor device, it is necessary to shorten the wavelength of an exposure light source for use in the photolithography when manufacturing the semiconductor device, in addition to the miniaturization of a mask pattern formed in a light-semitransmissive film. In recent years, the wavelength of an exposure light source in the manufacture of a semiconductor device has been shortened from KrF excimer laser (wavelength 248 nm) to ArF excimer laser (wavelength 193 nm). Among the various glass substrates, the synthetic quartz glass substrate is particularly suitable as a substrate of a mask blank of this invention for use in the formation of a high-definition transfer pattern because it has high transparency in the range of ArF excimer laser to shorter wavelengths.

The light-semitransmissive film 2 is made of a material that can be dry-etched with an etching gas containing a fluorine-based gas. The light-semitransmissive film 2 is a film having a function to transmit exposure light therethrough at a predetermined transmittance. The light-semitransmissive film preferably has a transmittance of 1% or more for exposure light. The light-semitransmissive film 2 is preferably a phase shift film for use in a halftone phase shift mask or a light-semitransmissive film for use in an enhancer phase shift mask.

The light-semitransmissive film (phase shift film) 2 of the halftone phase shift mask blank is configured to transmit light having an intensity that does not substantially contribute to exposure (e.g. 1% to 30% at an exposure wavelength) and to provide a predetermined phase difference (e.g. 180 degrees). By means of light-semitransmissive portions formed by patterning the light-semitransmissive film 2 and light-transmissive portions formed with no light-semitransmissive film and configured to transmit light having an intensity that substantially contributes to exposure, the halftone phase shift mask provides a relationship in which the phase of the light transmitted through the light-semitransmissive portions is substantially inverted with respect to the phase of the light transmitted through the light-transmissive portions. Consequently, the lights having passed near the boundaries between the light-semitransmissive portions and the light-transmissive portions and bent into the others' regions due to the diffraction phenomenon cancel each other out. This makes the light intensity at the boundaries approximately zero to thereby improve the contrast, i.e. the resolution, at the boundaries.

On the other hand, while the light-semitransmissive film 2 of the mask blank for the enhancer phase shift mask is also configured to transmit light having an intensity that does not substantially contribute to exposure (e.g. 1% to 30% at an exposure wavelength), it is a film configured to provide only a small phase difference to exposure light transmitted therethrough (e.g. the phase difference is 30 degrees or less, preferably 0 degrees), which is the point that differs from the light-semitransmissive film of the halftone phase shift mask blank.

The light-semitransmissive film 2 is preferably made of a material containing silicon and nitrogen. The light-semitransmissive film 2 is preferably made of a material containing silicon, a transition metal, and nitrogen. As the transition metal in this case, there can be cited one or more metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pb), or alloys of these metals. The material of the light-semitransmissive film 2 may contain, in addition to the elements described above, an element such as nitrogen (N), oxygen (O), carbon (C), hydrogen (H), or boron (B). The material of the light-semitransmissive film 2 may contain an inert gas such as helium (He), argon (Ar), krypton (Kr), or xenon (Xe).

The material described above exhibits a high etching rate in dry etching with an etching gas containing a fluorine-based gas and is suitable for obtaining various properties required for a light-semitransmissive film. Particularly, the material described above is desirable as a material that forms a phase shift film required to precisely control the phase of exposure light transmitted therethrough or a light-semitransmissive film for an enhancer phase shift mask having a structure in which a phase delaying film and a phase advancing film are laminated together. When the light-semitransmissive film 2 is the halftone phase shift film or the semitransparent laminated film, a percent [%] calculated by dividing the content [at %] of a transition metal (M) in the film by the total content [at %] of the transition metal (M) and silicon (Si) in the film (hereinafter referred to as a M/[M+Si] ratio) is preferably 35% or less, more preferably 25% or less, and further preferably 20% or less. The transition metal is an element with a high extinction coefficient and also with a high refractive index compared to silicon. If the refractive index of a material forming a first film is too high, the amount of change in phase due to a change in film thickness becomes large so that it is difficult to control both the phase and the transmittance.

The light-semitransmissive film 2 preferably includes an uppermost layer formed of a material containing silicon and oxygen at a position farthest from the transparent substrate 1. This is because the resistance of the light-semitransmissive film 2 against dry etching which is carried out when removing the later-described etching stopper film can be more enhanced. This uppermost layer may be formed by carrying out a treatment of oxidizing a surface layer after forming the light-semitransmissive film 2, or may be formed by laminating an uppermost layer by sputtering or the like.

The light-shielding film 4 is made of a material that contains tantalum (Ta) and one or more elements selected from hafnium (Hf) and zirconium (Zr) and contains no oxygen except in a surface layer thereof. Preferably, the light-shielding film 4 is made of a material that can be dry-etched with an etching gas containing a chlorine-based gas but no oxygen gas and that has etching selectivity relative to the light-semitransmissive film against dry etching with the etching gas containing the fluorine-based gas. As the material satisfying such properties, there can be cited a tantalum-hafnium alloy, a tantalum-zirconium alloy, a tantalum-hafnium-zirconium alloy, or a compound of such an alloy containing elements other than oxygen. The material of the light-shielding film 4 may contain an element such as nitrogen (N), carbon (C), hydrogen (H), or boron (B). The material of the light-shielding film 4 may contain an inert gas such as helium (He), argon (Ar), krypton (Kr), or xenon (Xe).

The light-shielding film 4 made of the material such as the tantalum-hafnium alloy or the like, when containing no oxygen, can achieve an etching rate that enables the formation of a fine pattern by dry etching with an etching gas containing a chlorine-based gas but no oxygen gas. The material such as the tantalum-hafnium alloy or the like has a property that the etching rate with the etching gas containing the chlorine-based gas but no oxygen gas is significantly reduced as the oxygen content in the material increases. Even if the oxidation has proceeded in the surface layer (range to a depth of about 5 nm or less from a surface of the film) of the light-shielding film 4, a fine pattern can be formed in the light-shielding film 4 with respect to the surface layer using a physical etching action. However, if the oxidation has proceeded over the entire light-shielding film 4, it is difficult to form a fine pattern. Therefore, the light-shielding film 4 is preferably made of a material containing no oxygen except in the surface layer where the oxidation is unavoidable. The material containing no oxygen referred to herein is not limited to a material containing no oxygen at all, but covers a material containing oxygen to a degree that is incorporated due to the influence of contaminants or the like when forming the light-shielding film 4 by sputtering (a material with an oxygen content of 5 at % or less).

The material forming the light-shielding film 4 is required to have the above-described etching properties. In order for the material such as the tantalum-hafnium alloy or the like to have such etching properties, a ratio, given in percent, obtained by dividing the total content [at %] of hafnium and zirconium in the material by the total content [at %] of tantalum, hafnium, and zirconium in the material (hereinafter referred to as a [Hf+Zr]/[Ta+Hf+Zr] ratio) is preferably 10% or or more. Tantalum can be dry-etched not only with the oxygen-free chlorine-based gas, but also with the etching gas containing the fluorine-based gas and, therefore, the etching resistance to the etching gas containing the fluorine-based gas cannot be ensured only with tantalum. If the [Hf+Zr]/[Ta+Hf+Zr] ratio is less than 10%, the resistance to the etching gas containing the fluorine-based gas is reduced so that it is difficult to serve as an etching mask in dry etching with the etching gas containing the fluorine-based gas when forming a transfer pattern in the light-semitransmissive film 2. On the other hand, in terms of the resistance to a cleaning liquid when cleaning a transfer mask, it is better to increase the tantalum content ratio so that the [Hf+Zr]/[Ta+Hf+Zr] ratio of the light-shielding film 4 is preferably 50% or less.

In the mask blank of this invention, the laminated structure of the light-semitransmissive film 2, the etching stopper film 3, and the light-shielding film 4 is required to have an optical density (OD) of 2.8 or more, preferably 3.0 or more, for exposure light. As this exposure light, it is preferable to use ArF excimer laser (wavelength: 193 nm). In terms of the functions required for the films in the laminated structure (laminated film), it is desired that the light-shielding film 4 have a higher optical density. The simplest method of providing the light-shielding film 4 with a higher optical density is to increase the thickness thereof. On the other hand, the light-shielding film 4 is required to serve as an etching mask in dry etching to form a fine transfer pattern in the light-semitransmissive film. In order to accurately form the fine transfer pattern in the light-semitransmissive film, it is desired that the thickness of the light-shielding film 4 be as small as possible. In order for the light-shielding film 4 to simultaneously satisfy these two requirements, it is desirable to increase the optical density of a material forming the light-shielding film 4. Accordingly, the light-shielding film 4 is preferably made of a material containing no non-metallic element which serves to reduce the optical density. In view of this, as the material forming the light-shielding film 4, it is preferable to use a material selected from a tantalum-hafnium alloy, a tantalum-zirconium alloy, and a tantalum-hafnium-zirconium alloy. The thickness of the light-shielding film 4 is preferably 40 nm or less and more preferably 35 nm or less.

In order to reduce the reflectance for exposure light, the light-shielding film 4 may have a structure in which a light-shielding layer and an antireflection layer are laminated in this order from the light-semitransmissive film side. In the mask blank of this invention, it is desired that the light-shielding film 4 be as thin as possible while having a high optical density. The light-shielding layer is the same as in the case of the above-described light-shielding film with no antireflection layer provided. As the antireflection layer, use is generally made of a material whose optical density is low. In order to allow the total thickness of the light-shielding film 4 to be 40 nm or less, the thickness of the antireflection layer is desirably 5 nm or less. The antireflection layer should be made of a material having resistance to at least the etching gas containing the fluorine-based gas. A material containing chromium is used as the etching stopper film 3 and the antireflection layer should serve as an etching mask when patterning the etching stopper film 3 by dry etching. Taking into account these points, it is preferable to use, as the antireflection layer, a material containing at least one or more elements from oxygen and nitrogen in the above-described material that can be used as the light-shielding film 4.

In transfer mask manufacturing processes (details will be described later), the etching stopper film 3 is required to have a function to prevent etching of the light-semitransmissive film 2 in dry etching with an oxygen-free chlorine-based gas which is carried out for forming a light-shielding pattern (a pattern such as a light-shielding band) that remains on a light-semitransmissive pattern at the stage of the completion of a transfer mask. Simultaneously, since the etching stopper film 3 should be finally removed in an area where the light-shielding film 4 was removed, the light-semitransmissive film 2 should have etching resistance to an etching gas for use in dry etching of the etching stopper film 3. Therefore, a material composed mainly of chromium is used as the etching stopper film 3.

In the transfer mask manufacturing processes, the light-shielding film 4 is patterned twice by dry etching. The first dry etching is carried out when forming a transfer pattern to be formed in the light-semitransmissive film (a light-semitransmissive pattern) in the light-shielding film 4. The second dry etching is carried out when forming a pattern to be formed in the light-shielding film 4 (a pattern such as a light-shielding band) in the light-shielding film 4. In either dry etching, an etching gas containing a chlorine-based gas but no oxygen gas is used. At the stage of the first dry etching, the oxidation of the light-shielding film 4 has hardly proceeded except in the surface layer thereof so that it is fully possible to form the pattern in the light-shielding film 4 at a normal etching bias with a tendency that a physical action is not so strong. However, at the stage of the second dry etching, the oxidation of the light-shielding film 4 has proceeded due to treatments such as cleaning carried out in the processes at the previous stage so that it is difficult to form the pattern in the light-shielding film 4 unless dry etching is carried out at a high etching bias (high bias state) with a tendency that a physical action is strong.

Figure 2:
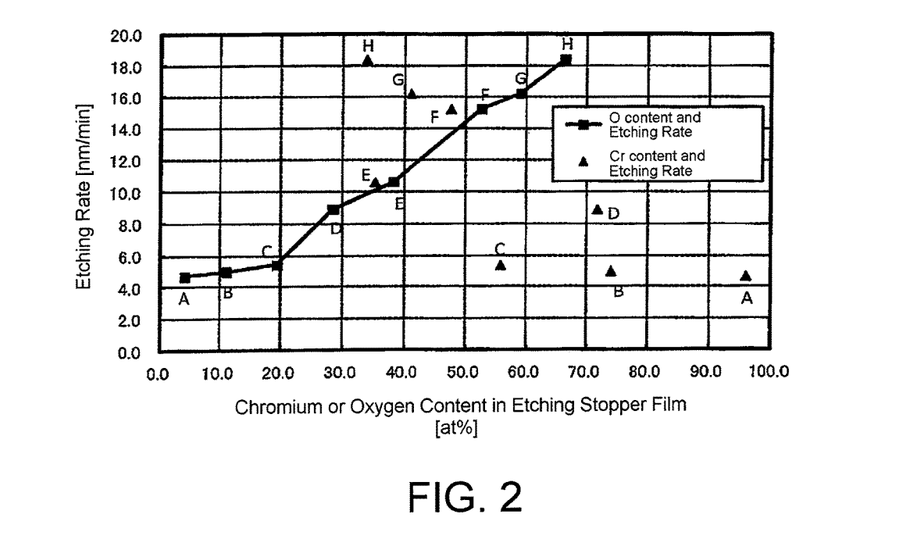
FIG. 2 is a diagram showing the relationship between the chromium content and the oxygen content in an etching stopper film and the etching rate with a chlorine-based gas.

The present inventors have considered that even if the same type of material containing chromium is used as the etching stopper film 3, when the light-shielding film 4 made of the material such as the tantalum-hafnium alloy or the like in which the oxidation has proceeded is patterned by dry etching with the oxygen-free chlorine-based gas in a high bias state, the etching stopper film 3 may possibly be lost. Accordingly, a test was conducted in which dry etching was carried out for 8 kinds of sample films of chromium-based materials shown in Table 1 in a high bias state using a chlorine-based gas ($Cl_2$) as an etching gas, thereby confirming the etching rates of the sample films. The etching rates of the sample films with the chlorine-based gas ($Cl_2$) are shown in FIG. 2. In this test, the etching bias was set to 50 W.

TABLE 1

| Film | | Content in Film [at %] | | | |
|---|---|---|---|---|---|
| Sample | Material | Cr | O | N | C |
| A | CrO-based | 95.9 | 4.1 | — | — |
| B | Cr(O)N-based | 74.0 | 11.0 | 15.0 | — |
| C | CrOCN-based | 55.7 | 19.3 | 16.2 | 8.8 |
| D | CrO-based | 71.7 | 28.3 | — | — |
| E | CrOCN-based | 35.1 | 38.1 | 16.4 | 10.4 |
| F | CrO-based | 47.5 | 52.5 | — | — |
| G | CrO-based | 41.0 | 59.0 | — | — |
| H | CrO-based | 33.7 | 66.3 | — | — |

In FIG. 2, the relationship between the oxygen content of each sample film and the etching rate thereof with the chlorine-based gas is indicated by a ■ plot, while the relationship between the chromium content of each sample film and the etching rate thereof with the chlorine-based gas is indicated by a ▲ plot. In FIG. 2, symbols assigned to the ■ plots and the ▲ plots correspond to symbols of the sample films. From these results, it is seen that the correlation is observed between the oxygen content and the etching rate with the chlorine-based gas. Further, it is also seen that the influence of containing nitrogen or carbon in the sample films is small. On the other hand, it is seen that the correlation between the chromium content and the etching rate with the chlorine-based gas is not so high.

Further, from the results of FIG. 2, it is seen that when the oxygen content in the chromium-based material film becomes greater than 20 at %, the increasing degree of the etching rate with the chlorine-based gas in the high bias state becomes high and further the etching rate itself becomes as high as 6.0 nm/min or more. When the light-shielding film 4 made of the material such as the tantalum-hafnium alloy or the like in which the oxidation has proceeded is dry-etched, an area where the light-shielding film 4 is removed at an early stage so that the etching stopper film 3 is exposed in the plane continues to be exposed to the oxygen-free chlorine-based gas in the high bias state until the completion of patterning of the light-shielding film 4. If the resistance to the dry etching in the high bias state using the oxygen-free chlorine-based gas is low, the etching stopper film 3 in that area is lost. As a result, a surface layer of the underlying light-semitransmissive film 2 is exposed to the oxygen-free chlorine-based gas in the high bias state so as to be damaged. As a result of studying the test results of FIG. 2 and so on, it has been concluded that the oxygen content in the chromium-based material film forming the etching stopper film 3 is required to be 20 at % or less.

Although not so significant as the oxygen content in the chromium-based material film, since the dry etching in the high bias state has a strong physical action tendency, the resistance to the dry etching in the high bias state using the oxygen-free chlorine-based gas changes depending on the chromium content as a metal component in the chromium-based material film. Taking into account the results of FIG. 2 and so on, the chromium content in the chromium-based material film forming the etching stopper film 3 is preferably 55 at % or more.

The material containing chromium forming the etching stopper film 3 tends to have a low optical density for exposure light compared to the material such as the tantalum-hafnium alloy or the like forming the light-shielding film 4. In order to achieve a predetermined optical density with the laminated structure of the etching stopper film 3 and the light-shielding film 4 at a smaller total thickness, it is desired that the thickness of the etching stopper film 3 be as small as possible. On the other hand, in terms of protecting the light-semitransmissive film 2 against the dry etching in the high bias state using the oxygen-free chlorine-based gas, the thickness of the etching stopper film 3 is desirably as large as possible. Taking these points collectively into account, the thickness of the etching stopper film 3 is preferably 8 nm or less. The thickness of the etching stopper film 3 is more preferably 3 nm or more. The thickness of the etching stopper film 3 is further preferably 5 nm or more and 7 nm or less.

The light-shielding film 4 may have a structure in which an uppermost layer is provided in contact with its surface layer on the side opposite to the light-semitransmissive film 2. This uppermost layer is preferably made of a material containing tantalum but substantially no hafnium or zirconium. It is possible to suppress the oxidation of the surface layer of the light-shielding film 4 by providing the uppermost layer. The thickness of the uppermost layer is required to be at least 3 nm or more for suppressing the oxidation of the surface layer of the light-shielding film 4 and is preferably 4 nm or more. Further, the thickness of the uppermost layer is preferably 10 nm or less and more preferably 8 nm or less.

Since the uppermost layer serves as a layer on the outermost surface side of the light-shielding film 4, it is preferable not to contain oxygen at a stage of forming the uppermost layer by sputtering or the like. Even if the uppermost layer is initially formed by a method that does not allow oxygen to be contained, the oxidation proceeds from its surface layer side when placed in the atmosphere. Hence, when a chlorine-based gas containing no oxygen gas is used in dry etching for forming a fine transfer pattern in the light-shielding film 4 including the uppermost layer, the dry etching should be carried out under a high bias condition at least for the uppermost layer. Therefore, even when the uppermost layer is provided, it is desirable to satisfy the same conditions of the etching stopper film and so on as in the case where the surface layer of the light-shielding film 4 is oxidized.

When the uppermost layer is provided on the light-shielding film 4, it is preferable that the surface layer of the light-shielding film 4 not be oxidized. For example, the oxidation of the surface layer of the light-shielding film 4 can be suppressed by forming the light-shielding film 4 and the uppermost layer in this order by sputtering and preventing, during the formation thereof, the transparent substrate 1 from being exposed to the atmosphere even once.

It may be configured that a hard mask film made of a material containing silicon and oxygen is provided on the light-shielding film 4. The material of the hard mask film can be patterned by dry etching with a fluorine-based gas, but has a high resistance to dry etching with a chlorine-based gas. In the case where this hard mask film is provided, first, a fine transfer pattern is formed in the hard mask film by dry etching with a fluorine-based gas using as a mask a fine transfer pattern formed in a resist film. Then, using as a mask the hard mask film formed with the fine pattern, a fine transfer pattern is formed in the light-shielding film 4 by dry etching with an oxygen-free chlorine-based gas.

A resist film is subjected to a film loss by dry etching with an oxygen-free chlorine-based gas or a fluorine-based gas. The film loss proceeds not only from an upper surface of a resist pattern, but also from pattern side walls (this is called side etching). The width of a pattern formed in the resist film is set large in anticipation of the amount of reduction in line width due to this side etching. The difference between the line width of a pattern to be actually formed in the light-shielding film 4 or the hard mask film and the line width of the pattern formed in the resist film is called an etching bias. Since the thickness of the hard mask film can be made smaller than that of the light-shielding film 4, it is possible to shorten the time of dry etching for forming a fine transfer pattern. That is, by providing the hard mask film made of the material containing silicon and oxygen on the light-shielding film 4, the etching bias of the pattern formed in the resist film can be made small.

Further, by providing the hard mask film, it is possible to suppress the oxidation of the surface layer of the light-shielding film 4. The thickness of the hard mask film is required to be at least 3 nm or more and is preferably 4 nm or more. Further, the thickness of the hard mask film is required to be 15 nm or less and is preferably 10 nm or less and more preferably 8 nm or less. The hard mask film is preferably made of a material containing silicon and oxygen and further containing one or more elements selected from nitrogen, carbon, hydrogen, boron, and fluorine. The hard mask film is particularly preferably made of the material composed of silicon and oxygen or the material composed of silicon, oxygen, and nitrogen.

The hard mask film is lost in dry etching with a fluorine-based gas which is carried out when forming a fine pattern in the light-semitransmissive film 2. Therefore, the oxidation of the light-shielding film proceeds from its surface layer side due to a cleaning treatment and so on after patterning the light-semitransmissive film 2. Hence, dry etching with an oxygen-free chlorine-based gas which is carried out when forming a light-shielding band pattern in the light-shielding film 4 should be carried out under a high bias condition. Therefore, even when the hard mask film is provided, it is desirable to satisfy the same conditions of the etching stopper film and so on as in the case where the surface layer of the light-shielding film 4 is oxidized.

When the hard mask film is provided on the light-shielding film 4, it is preferable that the surface layer of the light-shielding film 4 not be oxidized. For example, the oxidation of the surface layer of the light-shielding film 4 can be suppressed by forming the light-shielding film 4 and the hard mask film in this order by sputtering and preventing, during the formation thereof, the transparent substrate 1 from being exposed to the atmosphere even once.

As a method of forming the light-semitransmissive film 2, the etching stopper film 3, and the light-shielding film 4 on the transparent substrate 1, sputtering, for example, can be preferably cited, but this invention is not necessarily limited thereto.

This invention also provides a transfer mask in which a light-semitransmissive pattern is formed in the light-semitransmissive film of the mask blank and a light-shielding band pattern is formed in the light-shielding film of the mask blank, and a method of manufacturing such a transfer mask. FIGS. 3A to 3H are cross-sectional views showing manufacturing processes of a transfer mask according to this invention. A transfer mask manufacturing method according to this invention will be described in accordance with the manufacturing processes shown in FIGS. 3A to 3H. Details of the structure of the mask blank 100 (see FIG. 3A) for use in this invention are as described above.

Figure 3A:
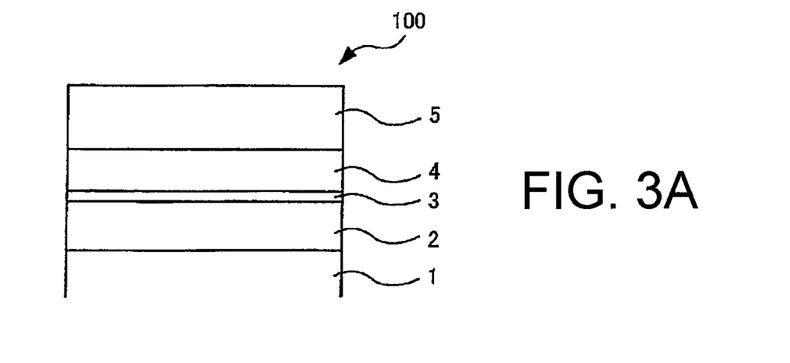
FIG. 3A is a cross-sectional view showing a manufacturing process of a phase shift mask according to the first embodiment of this invention.
Figure 3B:
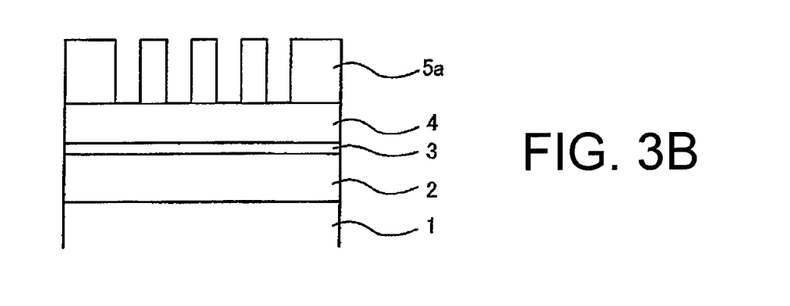
FIG. 3B is a cross-sectional view showing a manufacturing process of the phase shift mask according to the first embodiment of this invention.

First, a first resist film 5 of, for example, a positive type is formed on the mask blank 100 (see FIG. 3A). Then, pattern writing of a desired light-semitransmissive pattern (transfer pattern) to be formed in the light-semitransmissive film 2 is applied to the first resist film 5 formed on the mask blank 100 and, after the writing, a development treatment is carried out, thereby forming a first resist pattern 5a having the desired light-semitransmissive pattern (see FIG. 3B). Then, a light-shielding film 4a having the light-semitransmissive pattern is formed by dry etching using as a mask the first resist pattern 5a having the light-semitransmissive pattern (see FIG. 3C). For the light-shielding film 4 made of the material such as the tantalum-hafnium alloy or the like of this invention, it is preferable to carry out dry etching at a normal etching bias with a tendency that a physical action is not so strong, using an etching gas containing a chlorine-based gas but no oxygen gas. As the chlorine-based gas for use in the dry etching of the light-shielding film 4, there can be cited, for example, $Cl_2$, $SiCl_4$, $CHCl_3$, $CH_2Cl_2$, $CCl_4$, $BCl_3$, or the like. After forming the light-semitransmissive pattern in the light-shielding film 4, the remaining first resist pattern 5a is removed. The removal of the first resist pattern 5a is usually carried out by ashing with oxygen plasma.

Figure 3C:
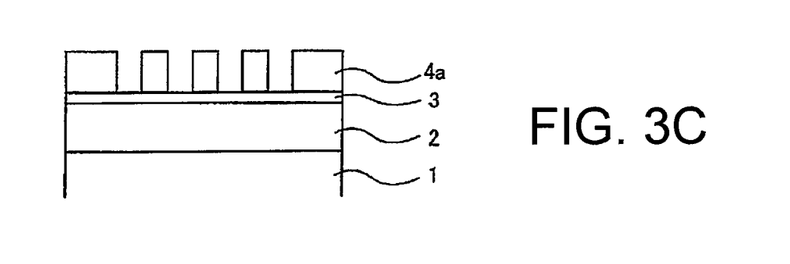
FIG. 3C is a cross-sectional view showing a manufacturing process of the phase shift mask according to the first embodiment of this invention.

After the ashing treatment, a cleaning treatment is carried out. It cannot be avoided that the oxidation of the light-shielding film 4 proceeds due to these treatments.

Figure 3D:
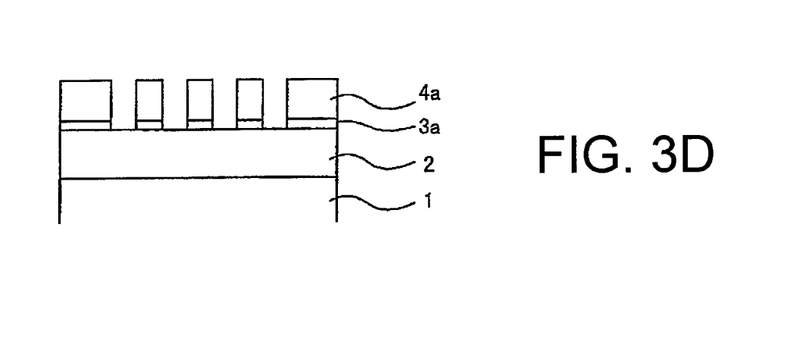
FIG. 3D is a cross-sectional view showing a manufacturing process of the phase shift mask according to the first embodiment of this invention.

Then, an etching stopper film 3a having the light-semitransmissive pattern is formed by dry etching using as a mask the light-shielding film 4a having the light-semitransmissive pattern (see FIG. 3D). In this dry etching, a mixed gas of chlorine-based gas and oxygen gas is used as an etching gas. As the chlorine-based gas, it is possible to use the one used for the light-shielding film 4. Since oxygen plasma impinges also on the light-shielding film 4 in the dry etching of the etching stopper film 3, the oxidation of the light-shielding film 4 further proceeds due to this treatment.

Figure 3E:
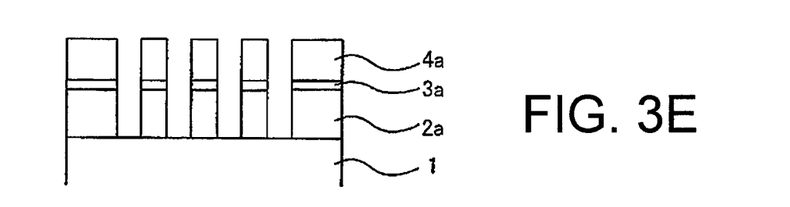
FIG. 3E is a cross-sectional view showing a manufacturing process of the phase shift mask according to the first embodiment of this invention.
Figure 3F:
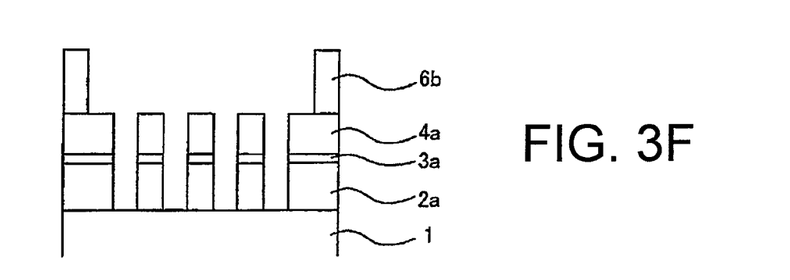
FIG. 3F is a cross-sectional view showing a manufacturing process of the phase shift mask according to the first embodiment of this invention.

Then, a light-semitransmissive film (light-semitransmissive pattern) 2a having the light-semitransmissive pattern is formed by dry etching using as a mask the light-shielding film 4a having the light-semitransmissive pattern (see FIG. 3E). In this dry etching, as an etching gas, use is made of an etching gas containing a fluorine-based gas such as $SF_6$, $CHF_3$, $CF_4$, $C_2F_6$, or $C_4F_8$. Among the fluorine-based gases, $SF_6$ exhibits high etching selectivity to the transparent substrate 1 and thus is preferable.

Then, a second resist film 6 is formed on the light-shielding film 4a. Then, pattern writing of a desired light-shielding band pattern (transfer pattern) to be formed in the light-shielding film 4 is applied to the second resist film 6 and, after the writing, a development treatment is carried out, thereby forming a second resist pattern 6b having the desired light-shielding band pattern (see FIG. 3F). Then, a light-shielding film 4b having the light-shielding band pattern is formed by dry etching using as a mask the second resist pattern having the light-shielding band pattern (see FIG. 3G).

Figure 3G:
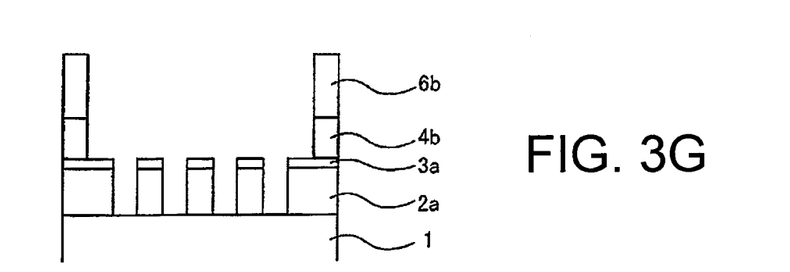
FIG. 3G is a cross-sectional view showing a manufacturing process of the phase shift mask according to the first embodiment of this invention.
Figure 3H:
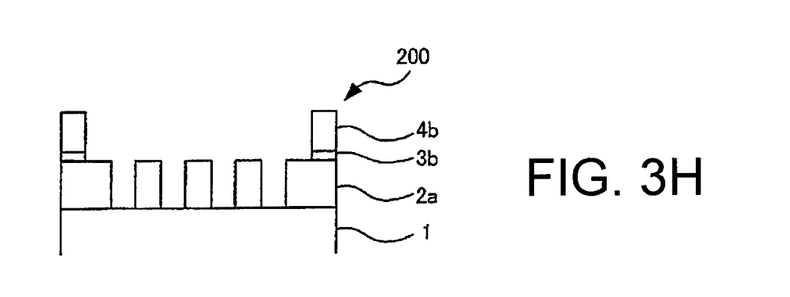
FIG. 3H is a cross-sectional view showing a manufacturing process of the phase shift mask according to the first embodiment of this invention.

In this dry etching, an etching gas itself used is a chlorine-based gas which is the same as that used when forming the light-semitransmissive pattern in the light-shielding film 4. However, in the light-shielding film 4a at this stage, the oxidation of the material has proceeded considerably and, therefore, the etching rate becomes significantly small at the etching bias in the dry etching when forming the light-semitransmissive pattern in the light-shielding film 4 so that it is difficult to accurately form the light-shielding band pattern. Therefore, the dry etching when forming the light-shielding band pattern in the light-shielding film 4a is carried out at an etching bias that is significantly higher than the etching bias in the dry etching when forming the light-semitransmissive pattern in the light-shielding film 4. The etching stopper film 3a is made of the material having a high resistance to the dry etching in the high bias state using the oxygen-free chlorine-based gas and, therefore, there is no possibility that the etching stopper film 3a is locally lost to damage a surface layer of the light-semitransmissive film 2a by this dry etching. After the light-shielding band pattern is formed in the light-shielding film 4a, the remaining second resist pattern 6b is removed.

Then, an etching stopper film 3b having the light-shielding band pattern is formed by dry etching using as a mask the light-shielding film 4b having the light-shielding band pattern. In a transfer mask of this invention, a light-shielding band is formed by a laminated structure of the etching stopper film 3b and the light-shielding film 4b. Thereafter, predetermined cleaning is carried out, thereby obtaining a transfer mask 200 (see FIG. 3H).

As described above, the transfer mask of this invention is such that the light-semitransmissive pattern is formed in the light-semitransmissive film of the mask blank of this invention and that the light-shielding band pattern is formed in the etching stopper film and the light-shielding film of the mask blank of this invention. Specifically, the transfer mask of this invention is a transfer mask having a structure in which a light-semitransmissive pattern and a light-shielding band pattern are laminated on a main surface of a transparent substrate, wherein the light-semitransmissive pattern is made of a material that can be dry-etched with an etching gas containing a fluorine-based gas, wherein the light-shielding band pattern has a laminated structure of a light-shielding film pattern having a pattern of a light-shielding band and an etching stopper film pattern provided between the light-semitransmissive pattern and the light-shielding film pattern and having the pattern of the light-shielding band, wherein the light-shielding film pattern is made of a material containing tantalum and one or more elements selected from hafnium and zirconium, and wherein the etching stopper film pattern is made of a material containing chromium with an oxygen content of 20 at % or less.

On the other hand, as a modification of the mask blank of this invention, it may be configured that the etching stopper film 3 is made of a material containing silicon and oxygen. The etching stopper film 3 made of the material containing silicon and oxygen has etching selectivity relative to the light-shielding film 4 against dry etching with the etching gas containing the chlorine-based gas but no oxygen gas. The etching stopper film 3 in the mask blank of this modification remains on the light-semitransmissive film 2 formed with a light-semitransmissive pattern, when a transfer mask is manufactured from this mask blank. The etching stopper film 3 made of the material containing silicon and oxygen forms a light-semitransmissive pattern with a laminated structure of itself and the light-semitransmissive film when the transfer mask is completed. Taking these into account, it is necessary to select, as the material forming the etching stopper film 3, a material that simultaneously satisfies two conditions that the material has etching selectivity relative to the light-shielding film 4 against dry etching with the etching gas containing the chlorine-based gas but no oxygen gas and that the material can serve as one of the layers forming the light-semitransmissive pattern.

As the material that simultaneously satisfies these conditions, there can be cited a material containing silicon and oxygen. The material containing silicon and oxygen is such that the transmittance for exposure light is relatively high, while the phase shift amount is relatively small, and therefore, the influence exerted on the optical properties of the light-semitransmissive pattern as the laminated structure of itself and the light-semitransmissive film is relatively small. It is preferable that the material forming the etching stopper film 3 contain no metal. This is because if the etching stopper film 3 is made of a material containing a metal, the influence exerted on the optical properties of the light-semitransmissive pattern becomes large. As the material suitable for the etching stopper film 3 in this modification, there can be cited a material composed of one or more elements selected from silicon, oxygen, nitrogen, carbon, hydrogen, boron, and fluorine. Among these materials, the material composed of silicon and oxygen or the material composed of silicon, oxygen, and nitrogen is particularly preferable.

EXAMPLE

Hereinbelow, the embodiment of this invention will be described in further detail with reference to an Example.

Example 1

Hereinbelow, the embodiment of this invention will be described in further detail with reference to an Example.

There was prepared a transparent substrate 1 made of a synthetic quarts glass and having a main surface size of about 152 mm×about 152 mm and a thickness of about 6.25 mm. End faces and main surfaces of the transparent substrate 1 were each polished to a predetermined surface roughness and thereafter the transparent substrate 1 was subjected to a predetermined leaning treatment and drying treatment.

Then, the transparent substrate 1 was placed in a single-wafer DC sputtering apparatus and, using a mixed target of molybdenum (Mo) and silicon (Si) (Mo:Si=12 at %:88 at %), reactive sputtering (DC sputtering) was carried out in a mixed gas atmosphere of argon (Ar), nitrogen ($N_2$), and helium (He), thereby forming a light-semitransmissive film 2 made of molybdenum, silicon, and nitrogen (MoSiN film Mo:12 at %, Si:39 at %, N:49 at %) to a thickness of 61 nm on the substrate 1. The composition of the MoSiN film was the results obtained by Auger electron spectroscopy (AES). Hereinafter, this also applies to other films.

Then, a treatment of forming an oxide layer in a surface layer of the MoSiN film (light-semitransmissive film 2) was applied to the transparent substrate 1 having formed thereon the light-semitransmissive film 2. Specifically, using a heating furnace (electric furnace), a heat treatment was carried out in the atmosphere at a heating temperature of 450° C. for a heating time of 1 hour. The light-semitransmissive film 2 after the heat treatment was analyzed by Auger electron spectroscopy (AES). As a result, it was confirmed that an oxide layer was formed to a thickness of about 1.5 nm from a surface of the light-semitransmissive film 2, and the oxygen content of the oxide layer was 42 at %. The transmittance and the phase difference at a wavelength of ArF excimer laser light (about 193 nm) were measured for the MoSiN film (light-semitransmissive film 2) after the heat treatment by a phase shift amount measuring apparatus and, as a result, the transmittance was 6.07% and the phase difference was 177.3 degrees.

Then, the transparent substrate 1 was placed in a single-wafer DC sputtering apparatus and, using a chromium (Cr) target, reactive sputtering (DC sputtering) was carried out in a mixed gas atmosphere of argon (Ar), nitrogen ($N_2$), and helium (He), thereby forming an etching stopper film 3 made of chromium and nitrogen (CrN film Cr:81 at %, N:19 at %) to a thickness of 5 nm in contact with the surface of the light-semitransmissive film 2.

Then, the transparent substrate 1 was placed in a single-wafer DC sputtering apparatus and, using a mixed target of tantalum (Ta) and hafnium (Hf) (Ta:Hf=80 at %:20 at %), sputtering (DC sputtering) was carried out in a xenon (Xe) gas atmosphere, thereby forming a light-shielding film 4 made of tantalum and hafnium (TaHf film Ta:86.4 at %, Hf:13.5 at %) to a thickness of 33 nm in contact with a surface of the etching stopper film 3. Further, a predetermined cleaning treatment was carried out, thereby obtaining a mask blank 100 of Example 1.

[Manufacture of Transfer Mask]

Then, using the mask blank 100 of Example 1, a transfer mask 200 of Example 1 was manufactured in the following manner. First, a first resist film 5 made of a chemically amplified resist for electron beam writing was formed to a thickness of 80 nm in contact with a surface of the light-shielding film 4 by spin coating (see FIG. 3A). Then, electron beam writing of a transfer pattern of the DRAM hp32 nm generation (fine pattern including SRAF of line width 40 nm) as a light-semitransmissive pattern to be formed in the light-semitransmissive film 2 was applied to the first resist film 5 and then a predetermined development treatment and cleaning treatment were carried out, thereby forming a first resist film 5 having the light-semitransmissive pattern (a first resist pattern 5a) (see FIG. 3B). Then, dry etching using a chlorine gas ($Cl_2$) was carried out using the first resist pattern 5a as a mask, thereby forming a light-shielding film 4a having the light-semitransmissive pattern. In this dry etching, the etching bias was 15 W which was a dry etching condition in the range of normal dry etching. Then, the first resist pattern 5a was removed (see FIG. 3C).

Then, dry etching using a mixed gas of chlorine and oxygen (gas flow rate ratio $Cl_2:O_2=4:1$) was carried out using as a mask the light-shielding film 4a having the light-semitransmissive pattern, thereby forming an etching stopper film 3a having the light-semitransmissive pattern (see FIG. 3D). Then, dry etching using an etching gas containing a fluorine-based gas ($SF_6$+He) was carried out using as a mask the light-shielding film 4a having the light-semitransmissive pattern, thereby forming a light-semitransmissive film 2a having the light-semitransmissive pattern (see FIG. 3E).

Then, a second resist film 6 made of a chemically amplified resist for electron beam writing was formed to a thickness of 80 nm in contact with the light-shielding film 4a. Then, electron beam writing of a light-shielding band pattern to be formed in the light-shielding film 4 was applied to the resist film 6 and then a predetermined development treatment and cleaning treatment were carried out, thereby forming a resist film 6b having the light-shielding band pattern (a second resist pattern 6b) (see FIG. 3F). Then, dry etching using a chlorine gas ($Cl_2$) was carried out using as a mask the second resist pattern having the light-shielding band pattern, thereby forming a light-shielding film 4b having the light-shielding band pattern (see FIG. 3G). In this dry etching, the etching bias was 50 W which could be said to be a condition with an etching bias significantly greater than that in dry etching in the range of normal dry etching. Then, the second resist pattern 6b was removed.

Then, dry etching using a mixed gas of chlorine and oxygen (gas flow rate ratio $Cl_2:O_2=4:1$) was carried out using as a mask the light-shielding film 4b having the light-shielding band pattern, thereby forming an etching stopper film 3b having the light-shielding band pattern. Thereafter, predetermined cleaning was carried out, thereby obtaining a transfer mask 200 (see FIG. 3H).

[Evaluation of Pattern Transfer Performance]

With respect to the manufactured transfer mask 200 of Example 1, a transferred image when exposed/transferred to a resist film on a semiconductor device using exposure light of wavelength 193 nm was simulated using AIMS193 (manufactured by Carl Zeiss). The exposed/transferred image of this simulation was verified and, as a result, there was no short circuit or disconnection of a pattern, thus fully satisfying the design specification. From this result, it can be said that when the transfer mask of Example 1 is set on a mask stage of an exposure apparatus to thereby carry out exposure and transfer on a resist film on a semiconductor device, a circuit pattern, which is finally formed on the semiconductor device, can be formed with high accuracy.

Comparative Example 1

Manufacture of Mask Blank

A mask blank was manufactured in the same manner as in Example 1 except the etching stopper film 3. The mask blank of Comparative Example 1 differs from the mask blank 100 of Example 1 in that a CrOCN film made of chromium, oxygen, carbon, and nitrogen (Cr:37 at %, O:38 at %, C:16 at %, N:9 at %) was formed to a thickness of 10 nm as an etching stopper film 3.

[Manufacture of Transfer Mask]

Then, a transfer mask of Comparative Example 1 was manufactured using the mask blank of Comparative Example 1 in the same manner as in the manufacture of the transfer mask of Example 1.

[Evaluation of Pattern Transfer Performance]

With respect to the manufactured transfer mask of Comparative Example 1, a transferred image when exposed/transferred to a resist film on a semiconductor device using exposure light of wavelength 193 nm was simulated using AIMS193 (manufactured by Carl Zeiss). The exposed/transferred image of this simulation was verified and, as a result, there were many portions where a pattern was short-circuited or disconnected, thus not satisfying the design specification. From this result, it can be said that when the transfer mask of Comparative Example 1 is set on a mask stage of an exposure apparatus to thereby carry out exposure and transfer on a resist film on a semiconductor device, a circuit pattern, which is finally formed on the semiconductor device, cannot be formed with high accuracy. Since there were many pattern short-circuited or disconnected portions in the transfer mask of Comparative Example 1, it was practically difficult to achieve defect correction using a mask defect correction apparatus.

While the preferred embodiment of this invention has been described, this invention is not limited thereto. It is apparent that various changes can be made without departing from the spirit of this invention and that those are also included in the scope of this invention.

DESCRIPTION OF SYMBOLS

1 transparent substrate
2 light-semitransmissive film
2a light-semitransmissive film having a light-semitransmissive pattern
3 etching stopper film
3a etching stopper film having a light-semitransmissive pattern
3b etching stopper film having a light-shielding band pattern
4 light-shielding film
4a light-shielding film having a light-semitransmissive pattern
4b light-shielding film having a light-shielding band pattern
5, 6 resist film
5a first resist pattern (resist film having a light-semitransmissive pattern)
6b second resist pattern (resist film having a light-shielding band pattern)
100 mask blank
200 transfer mask

The invention claimed is:

1. A mask blank comprising a light-semitransmissive film and a light-shielding film on a main surface of a transparent substrate, wherein:
   the light-semitransmissive film is made of a material that is capable of being dry-etched with an etching gas containing a fluorine-based gas,
   the light-shielding film, except for a surface layer thereof, is made of a material that consists of tantalum, one or more elements selected from hafnium and zirconium, and one or more elements selected from nitrogen, carbon, hydrogen, boron and inert gases,
   the surface layer of the light-shielding film is made of a material that consists of tantalum, oxygen, one or more elements selected from hafnium and zirconium, and one or more elements selected from nitrogen, carbon, hydrogen, boron and inert gases,
   a ratio, given in percent, obtained by dividing the total content [at %] of hafnium and zirconium in the light-shielding film by the total content [at %] of tantalum, hafnium and zirconium in the light-shielding film is 10% or more and 50% or less,
   an etching stopper film is provided between the light-semitransmissive film and the light-shielding film, and
   the etching stopper film is made of a material that contains chromium and has an oxygen content of 20 at % or less.

2. The mask blank according to claim 1, wherein the light-shielding film is made of a material that is capable of being dry-etched with an etching gas containing a chlorine-based gas but no oxygen gas and that has etching selectivity relative to the light-semitransmissive film for dry etching with the etching gas containing the fluorine-based gas.

3. The mask blank according to claim 1, wherein a thin film made of an organic material is provided in contact with the light-shielding film.

4. The mask blank according to claim 1, wherein the etching stopper film is made of a material that has a chromium content of 55 at % or more.

5. The mask blank according to claim 1, wherein a laminated structure of the light-semitransmissive film, the etching stopper film, and the light-shielding film has an optical density of 2.8 or more for exposure light.

6. The mask blank according to claim 1, wherein the etching stopper film has a thickness of 8 nm or less.

7. The mask blank according to claim 1, wherein the light-semitransmissive film is made of a material containing silicon and nitrogen.

8. The mask blank according to claim 1, wherein the light-semitransmissive film comprises an uppermost layer formed of a material containing silicon and oxygen at a position farthest from the transparent substrate.

9. The mask blank according to claim 1, wherein a hard mask film made of a material containing silicon and oxygen is provided on the light-shielding film.

* * * * *